United States Patent
Kishida

(10) Patent No.: US 7,908,915 B2
(45) Date of Patent: *Mar. 22, 2011

(54) METHOD FOR TIRE ROLLING SIMULATION ON MUD

(75) Inventor: Masahiro Kishida, Kobe (JP)

(73) Assignee: Sumitomo Rubber Industries, Ltd., Kobe (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/429,698

(22) Filed: Apr. 24, 2009

(65) Prior Publication Data

US 2009/0308149 A1    Dec. 17, 2009

(30) Foreign Application Priority Data

Jun. 13, 2008  (JP) ................................. 2008-155683

(51) Int. Cl.
*E01C 23/00*    (2006.01)
(52) U.S. Cl. ........................................................ 73/146
(58) Field of Classification Search ..................... 73/146, 73/146.8, 146.2
See application file for complete search history.

(56) References Cited

U.S. PATENT DOCUMENTS 7,343,788 B2 *  3/2008  Kishida et al. .................. 73/146

FOREIGN PATENT DOCUMENTS

| EP | 1297975 A1 | 4/2003 |
| EP | 1777634 A1 | 4/2007 |
| JP | 3332370 B1 | 10/2002 |

OTHER PUBLICATIONS

Rooney et al., "Application of Finite Element Analysis and Computational Fluid Dynamics to ATV Tire Design," Tire Science and Technology, vol. 30, No. 3, Jan. 1, 2002, pp. 198-212.
Berker et al., "Phenomenological models of viscoplastic, thixotropic, and granular materials," Rheologica Acta, vol. 31, No. 2, Mar. 1992, pp. 119-138.

* cited by examiner

*Primary Examiner* — Jewel Thompson
(74) *Attorney, Agent, or Firm* — Birch, Stewart, Kolasch & Birch, LLP

(57) ABSTRACT

A method for tire rolling simulation on mud comprises the steps of modeling a tire using finite elements to build a tire model, modeling a muddy road using finite volumes to build a muddy road model which can exhibit elastoplasticity property and failure property, and executing a numerical simulation in which the tire model is made to roll on the muddy road model in a predetermined condition.

6 Claims, 16 Drawing Sheets

METHOD FOR TIRE ROLLING SIMULATION ON MUD

BACKGROUND OF THE INVENTION

1. Field of the Invention

The present invention relates to a method for tire rolling simulation capable of predicting a tire performance on mud.

2. Description of the Related Art conventionally, tires have been developed by a procedure of prototype manufacturing, actual testing, and improved product manufacturing based on the results of the tests. This approach, however, is inefficient because prototype manufacturing and testing demand a lot of cost and time. To solve this drawback, computer simulation using a numerical analysis method, such as the finite element method, have been suggested. This approach enables the prediction of tire performance without manufacturing prototype tires.

Conventional simulation, however, is only performed on dry asphalt, wet asphalt, or sandy roads in which volume change remains, such as snow or desiccated soil. Therefore, the conventional approaches fail to accurately predict tire performance running on mud, which clings, to the tread surface of a tire.

SUMMARY OF THE INVENTION

It is a main object of the present invention to provide a method for tire rolling simulation, which can simulate the tire performance on mud with accuracy.

According to the present invention, a method for tire rolling simulation on mud comprises the steps of modeling a tire using finite elements to build a tire model, modeling a muddy road covered with mud using finite volumes to build a muddy road model which can exhibit elastoplasticity property, and failure property in which the finite volume fails under a certain tensile stress, but does not fail under any compression stress, and executing a numerical simulation in which the tire model is made to roll on the muddy road model in a predetermined condition.

DESCRIPTION OF THE PREFERRED EMBODIMENTS

An embodiment of the present invention will be described as follows based on the drawings.

The simulation method of this embodiment is to roll a tire model 2 on a road covered with thick mud layer. Here, mud comprises a mixture of mud particles of at least one kind of: clay having a particle size of less than 0.005 mm; silt having a particle size of from 0.005 to 0.075 mm; fine mud having a particle size of from 0.075 to 0.250 mm; medium mud having a particle size of from 0.250 to 0.850 mm; fine gravel having a particle size of from 0.850 to 2.00 mm; granule having a particle size of from 2.00 to 4.75 mm; or medium gravel having a particle size of from 4.75 to 19.00 mm. In order to set a muddy road condition, the particle size is preferably not more than 9.50 mm, and percentage of water content is preferably set in the range of from 10 to 50%, more preferably in the range of from 10 to 40%.

Figure 1:
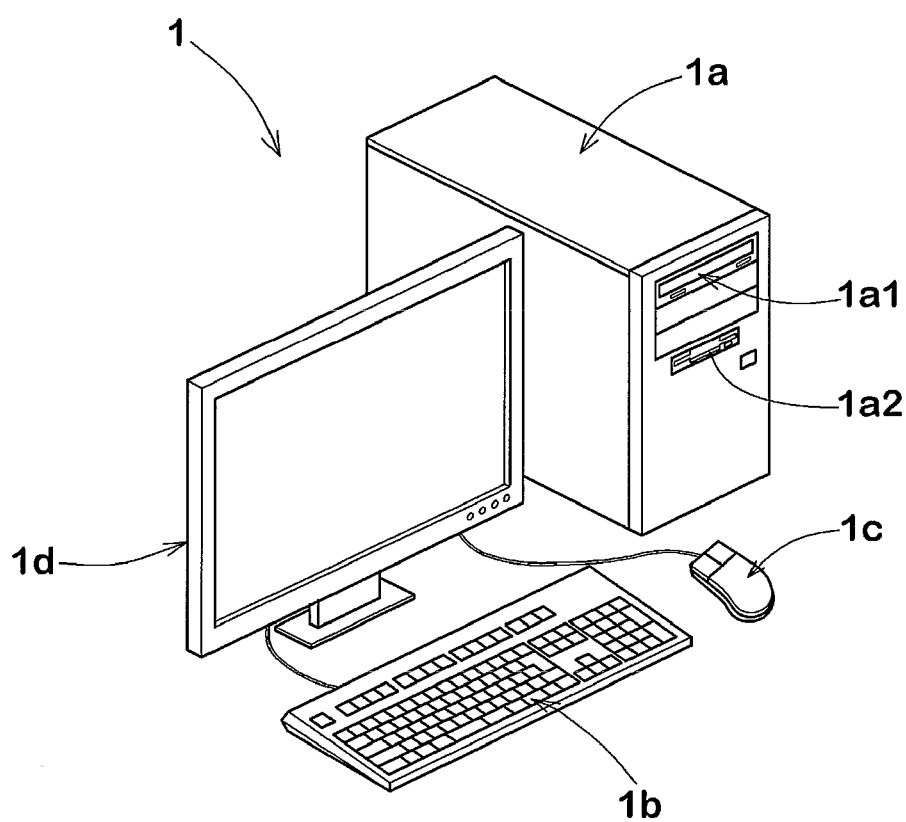
FIG. 1 is an illustration of a computer device for executing the simulation method.

FIG. 1 shows a computer device 1 used for the simulation method of the present invention. The computer device 1 comprises a main body 1a, a keyboard 1b, a mouse 1c, and a display device 1d. The main body 1a includes disk drives 1a1 and 1a2, a CPU, a ROM, a memory, and a bulk storage (which are not illustrated). The bulk storage stores programs, which execute the simulation method described below.

Figure 2:
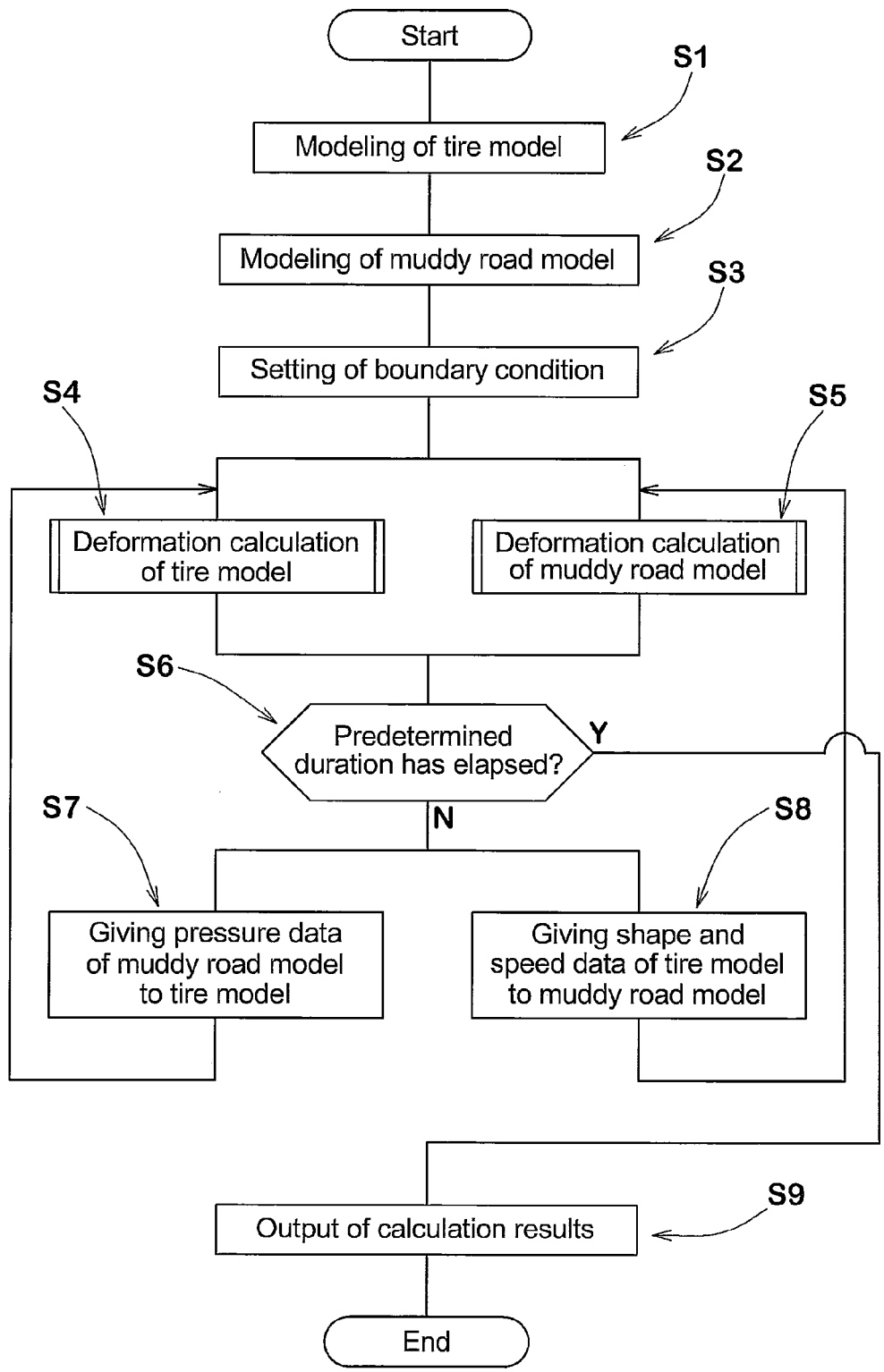
FIG. 2 is a flowchart showing an example of the simulation method.

FIG. 2 shows an example of the procedure of the invention simulation method. In the Step S1, a tire model 2 is set by modeling a tire using finite elements capable of numerical analysis. The numerical analysis includes, for example, the finite element method, the finite volume method, the finite difference method and the boundary element method. In this example, the finite element method and the finite volume method are employed.

Figure 3:
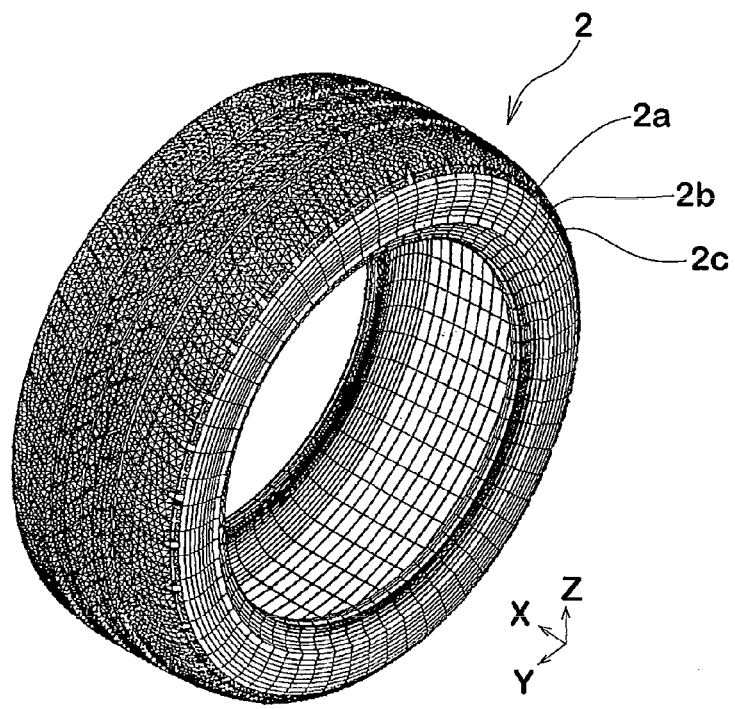
FIG. 3 is a perspective view of a tire model.

FIG. 3 is an example of the tire model 2 which is visualized in three-dimensional. In the tire model 2, the tire to be analyzed is divided into a finite number of small elements (LaGrange elements) $2a$, $2b$, $2c$ which are numerical data capable of calculation by the computer device 1. Further, the tire model 2 includes the coordinate values of the nodal points of each element $2a$, $2b$, $2c$ ..., their nodal numbers, and their properties such as density, Young's modulus, damping coefficient. Each of the elements $2a$, $2b$, $2c$ ... can be, but not limited to, rectangular plane elements or three-dimensional tetrahedral solid elements. Other various elements such as pentagonal and/or hexagonal solid elements are also employed.

Most of the rubber part of the tire is modeled using mainly three-dimensional solid elements. The tire model 2 shown in FIG. 3 is provided with tread grooves on the tread including longitudinal and transverse grooves, but these may be omitted. The circumferential length of one element arranged on the tread of the tire model 2 does not preferably exceed 25% of a circumferential length of the tread ground contact portion. This is useful for correct expression of the tread ground contact pressure or the distribution of the shearing force. The length of one element in the axial direction of the tire is preferably 20 mm or less.

Figure 4:
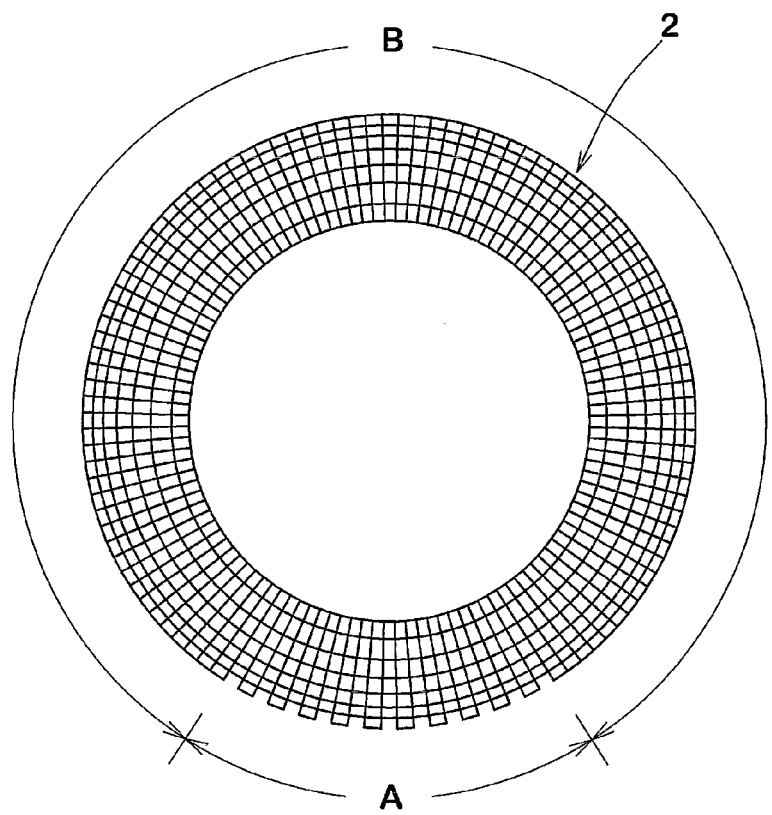
FIG. 4 is a side view of the tire model in another embodiment.

As shown in FIG. 4, the tire model 2 could be, but not limited to, a combination of the detailed pattern part "A" that has modeled grooves on the tread and the simple pattern part B that has no grooves on the tread. The detailed pattern part "A" is longer than the tread ground contact portion in the tire circumferential direction, but is shorter than the simple pattern part B. This helps to accelerate the calculation time by reducing the number of elements in the tire model 2 as a whole.

Figure 5:
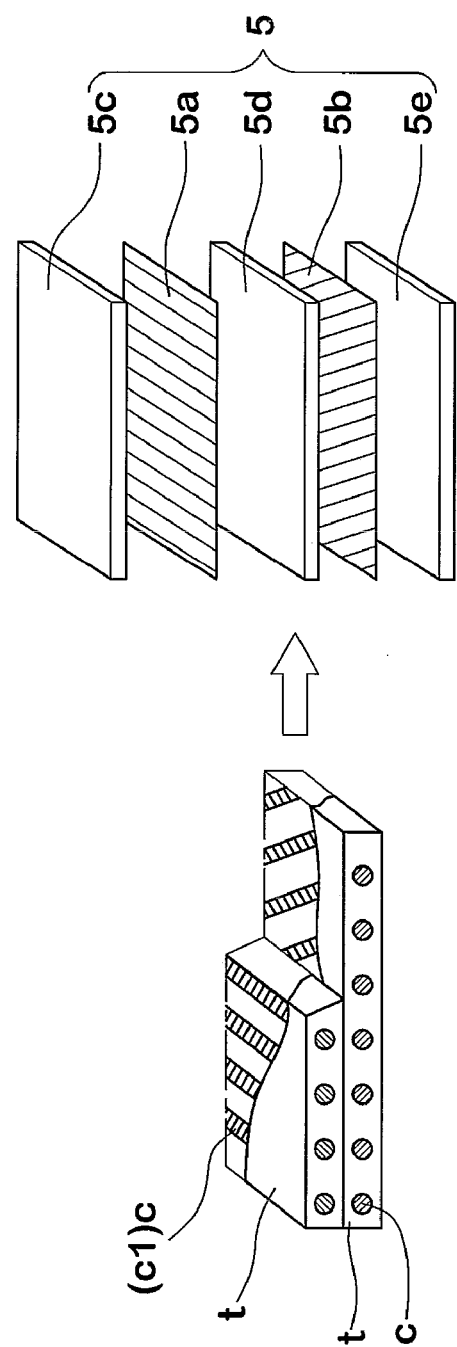
FIG. 5 is a perspective view explaining the modeling of cord reinforcements.

FIG. 5 shows an example of modeling of a cord reinforcement member c such as a belt ply, a carcass ply or the like. The cord reinforcement members c are modeled into membrane elements 5a and 5b, and the topping rubber part t is modeled into solid elements 5c, 5d and 5e. These elements are stacked in the direction of a thickness so as to form a shell element 5. The membrane elements 5a and 5b have anisotropy that is different stiffness in the longitudinal direction of the cord c1 and the direction orthogonal thereto. Further, a viscoelastic property is defined in the solid elements.

In the Step S2 shown in FIG. 2, a muddy road model is set by modeling muddy road in finite volumes capable of the numerical analysis above.

Figure 6:
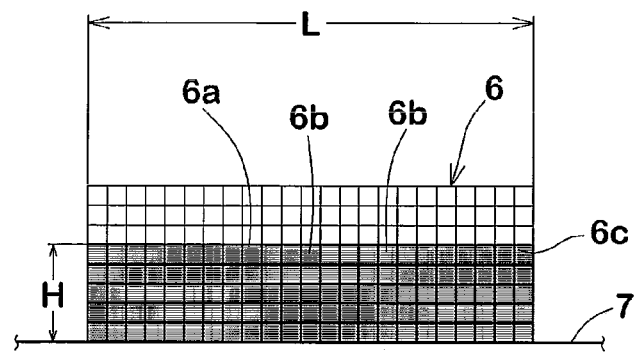
FIG. 6 is a side view, which visualizes an example of a muddy road model.

The muddy road model is modeled in this embodiment using Euler finite volumes. FIG. 6 shows an example of the muddy road model 6. The muddy road model 6 comprises: a three-dimensional regular finite volume mesh 6a fixed on the stiff element 7; and the numerical mud material 6c corresponding to the mud packed in the spaces 6b divided by the mesh 6a.

The mud material 6c can move in the space 6b of the mesh 6a having a bottom and sidewalls. The thickness H of the mud material 6c corresponds to the thickness of the mud layer to be evaluated. In this embodiment, the thickness is taken large enough to represent deep mud. Here, the term "one volume of the muddy road model" means one hexagonal space 6b and the numerical mud material 6c therein.

Further, the muddy road model 6 has a width and a length as necessary for the rotation of the tire model 2.

Figure 7A:
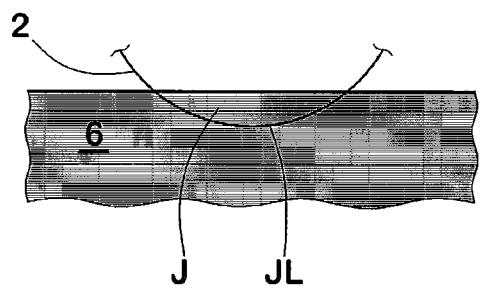
FIGS. 7(a) and 7(b) are side views showing an interaction between the tire model and the muddy road model.
Figure 7B:
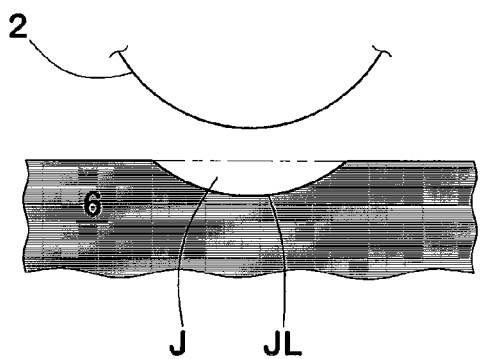

FIGS. 7(a) and 7((b) show a state in which the muddy road model 6 gets into contact with the tire model 2. In the deformation calculation of the tire model 2 and muddy road model 6 described later, the crossing portion J between the tire model 2 and the numerical mud material 6c is calculated based on mutual position information. Then, the tire model 2 and the mud material 6c are coupled at the boundary JL of the crossing portion J so as to interact with each other. Namely, the mud material 6c provides reaction force to the tire model 2 through the boundary JL. On the other hand, the tire model 2 provides the mud material 6c with a moving boundary surface (coupling surface). Therefore, mud material 6c in the cross portion J is moved out of the model so that the mud material 6c is compressed along the tread of the tire model.

Further, elastoplasticity property, failure property, and adhesion are defined in the mud material 6c.

The elastoplasticity is a state of a substance subjected to a stress greater than its elastic limit but not so great as to cause it to rupture, in which it exhibits both elastic and plastic properties. Namely, the numerical mud material 6c can change its physical property according to its state of the stress. The inventors have found that the behavior of mud with, but not limited to, a particle size can be represented by elastoplasticity. That is, the mud has viscosity, so that the deformation property thereof is dependent on the strain rate.

The elastoplasticity is preferably to be set according to mud properties that are to be evaluated for the target mud. In this embodiment, in order to satisfy this requirement, the elastoplasticity of the mud is determined based on results of the triaxial compression tests in which the mud is compressed with an axial force under an external pressure that is kept constant.

Meanwhile, the failure property is denoted as the following characteristics: the mud material 6c does not fail by compression stress (average compression stress) even if plastic strain occurs therein; and the mud material 6c fails by tensile stress (average tensile stress) when equivalent plastic strain reaches a particular value.

The equivalent plastic strain is kept constant regardless of the external pressure.

The failure property is also preferably to be set according to mud properties that are to be evaluated for the target mud. In this embodiment, in order to satisfy this requirement, the failure property of the mud is determined based on results of the hollow cylinder tensile tests.

Accordingly, by defining the elastoplasticity and failure property into the muddy road model 6, it is possible to obtain the tire performance on mud with high accuracy by the simulation.

Figure 8:
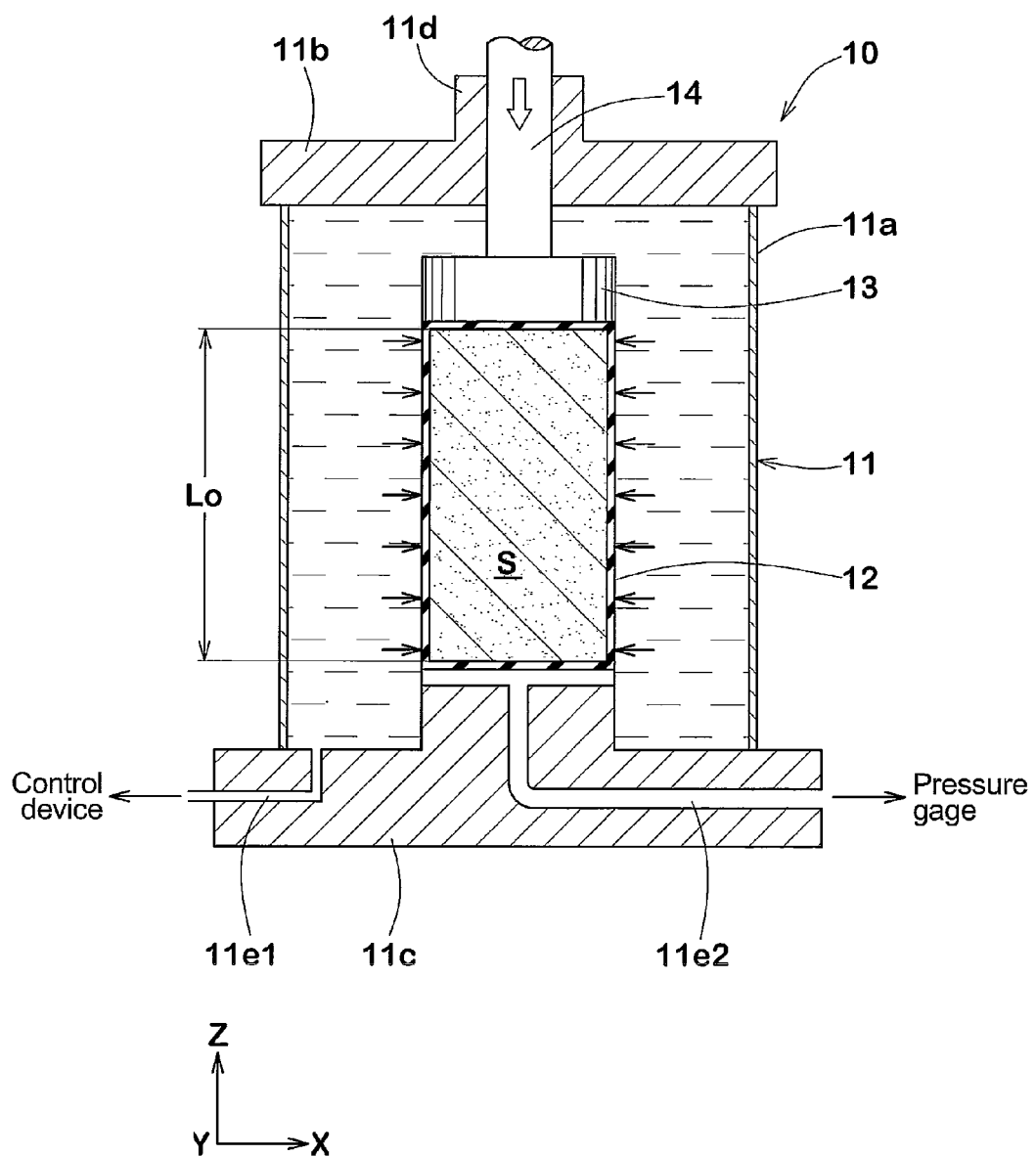
FIG. 8 is a cross-sectional view of a compression test machine for mud.

FIG. 8 schematically shows an example of a compression test machine 10 for mud. The compression test machine 10 comprises: a pressure chamber 11 filled with a liquid such as water; a cylindrical container 12 packed with mud S and placed inside the chamber 11; and an actuator 14 which can apply an axial compressive force on the container 12 and the mud inside.

The pressure chamber 11 comprises: a cylindrical main body 11a having a space therein; an upper cover 11b to close a top of the main body 11a with a guide 11d for the piston rod of the actuator 14; and a bottom cover 11c to close the bottom of the main body 11a. The internal pressure of the chamber 11 is kept constant by controlling amount of the liquid using a control device (not shown). The bottom cover 11c is provided with a passage 11e1 connecting the bottom of the container 12 to the control device and a second passage 11e2 connected to a pressure gage (not shown).

The cylindrical container 12 has a thin and soft sidewall made of rubber or the like such that it does not have substantial stiffness. In this embodiment, the container 12 has a diameter of about 5 cm. Further, test mud S is tightly packed in the container 12. Therefore, the mud S receives pressure from the liquid in the chamber 11 through the soft sidewall of the container 12. Further, the bottom of the container 12 is fixed on the lower cover 11c, and its top is pushed by the piston rod of the actuator 14. Also, the sidewall of the container 12 receives liquid pressure in the chamber 11. The liquid pressure in the chamber 11 is defined as external pressure for the mud S.

Since the physical property of mud varies according to the stress state thereof, it is desirable that the compression test is performed under at least two, or preferably three different levels of external pressure acting on mud. Further, the levels of external pressure are preferably determined in consideration of the contact pressure of the tire. In this embodiment, the mud compression tests have been performed under three levels of external pressure of 98 kPa, 196 kPa, and 294 kPa, respectively.

In this triaxial compression test, the following steps are performed: setting the external pressure being applied to the container 12; compressing the container 12; and measuring various parameters such as the force, the displacement and/or the volume change of the mud.

Figure 9:
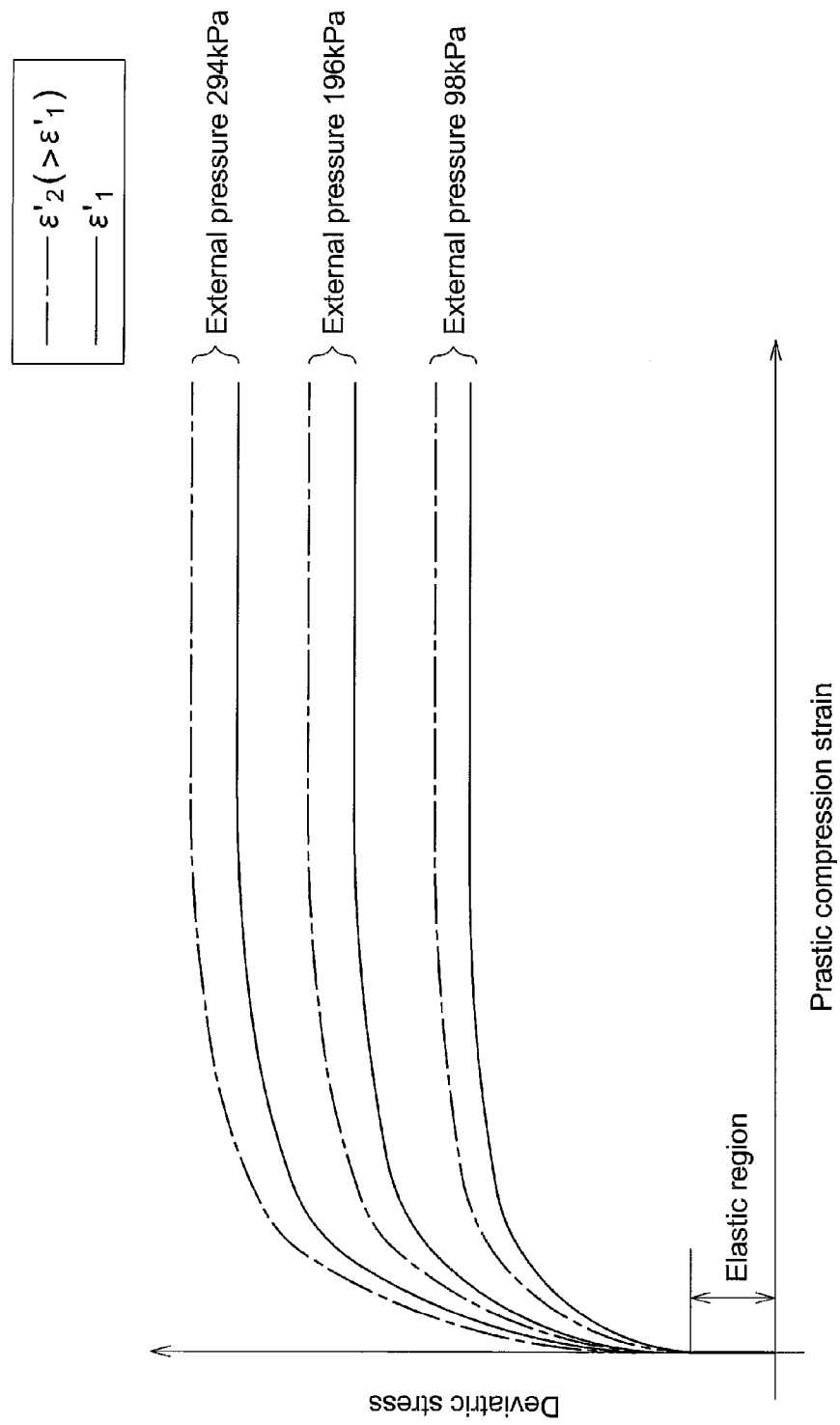
FIG. 9 is a graph showing a typical relationship between the deviatoric stress and plastic compressive strain of mud.

In such a compression test, the mud S filled in the container 12 is in a triaxial stress state receiving external pressure in X, Y, and Z directions and compressive axial force in Z direction from the actuator 14. Under a constant external pressure, when increasing the axial force, particles of the mud begin to slip, and then the container 12 bulges in its radial direction. As shown in FIG. 9, the relationship between the axial stress and the axial plastic compression strain of the mud is obtained from the result of these compression tests.

The actuator 14 is pressed down by the velocities $\epsilon'1$ and $\epsilon'2$ ($>\epsilon'1$) under each of the three leveled external pressures to reflect strain velocity in the simulation.

More specifically, the vertical axis in FIG. 9 shows the deviatoric stress ($\sigma a - \sigma r$) of the mud, and the horizontal axis shows the axial plastic compression strain $\epsilon a$ of the mud. These are calculated as follows.

$$\epsilon a = \Delta L / L0$$

L0: original axial length of the mud filled in the container
$\Delta L$: change of axial Length of the mud
$\sigma a$: Maximum principal stress ($=F_{ext}/A$)
  $F_{ext}$: axial compressive force
  A: Current nominal cross-section area of the mud filled in the container
$\sigma r$: minimum principal stress (=external pressure acting on mud)

sliding is started between the particles having smaller contact force and gradually increases as the deviatoric stress increases, until complete sliding occurs at the peak of the axial stress-strain curve. This sliding also causes the increase of the stress to slow down. This means that mud exhibits elastoplasticity. As sliding continues after the peak of the axial stress, the axial stress decreases slowly until it is saturated.

FIG. 9 shows that the relationship between the axial plastic compression strain $\epsilon a$ and the deviatoric stress ($\sigma a - \sigma r$) of the mud S varies according to the external pressure. That is, when the compression velocity is higher, the deviatonic stress is also higher. The strain rate dependency appears prominently.

Further, in each of the six curves shown in FIG. 9, in this embodiment, the stress-strain relationship, namely the elastoplasticity, under three different levels of external pressures and two different levels of strain velocities as obtained in the compression tests, is defined as the elastic-plastic relationship of the muddy road model 6. In other words, in the simulation step, each finite volume of the muddy road model 6 behaves according to the relationship shown in FIG. 9. Further, the computer device 1 depicts these curves shown in FIG. 9 as functions and/or approximate curves and stores them. In the elastoplasticity in FIG. 9, the stress-strain relationship excepting under each of the above mentioned predetermined levels of external pressures and strain velocities can be obtained by interpolation.

Figure 10:
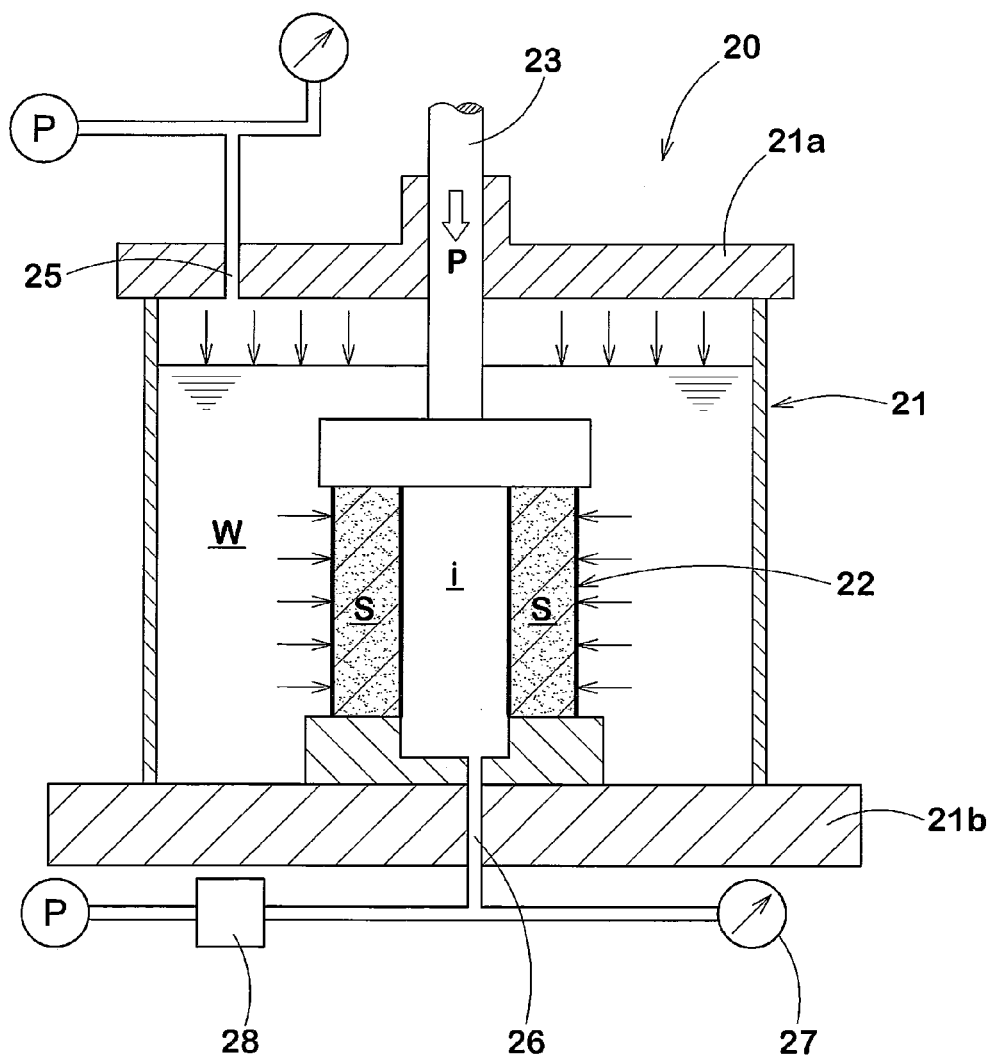
FIG. 10 is a front cross-sectional view of a hollow cylinder tensile test machine for mud.

FIG. 10 shows an embodiment of a tensile test machine 20 for hollow cylinder tensile tests to study the failure property of mud. The tensile test machine 20, as well as the triaxial compression tests machine 10, comprises:

a pressure chamber 21 filled with a liquid W such as water; a cylindrical container 22 having a hollow (i) therein and packed with mud S and placed inside the chamber 21; and an actuator 23 which can apply an axial compressive force on the container 22 and the mud S.

The container 22 has a thin and soft sidewall made of rubber or the like such that it does not have substantial stiffness. The pressure chamber 21 comprises: an upper cover 21a and a bottom cover 21b. The upper cover 21a having a flow channel 25 to inflate high-pressure air from a pressure pump P so as to the outer surfaces of the container 22 can be applied a pressure Po through the liquid W. The bottom cover 21b having a flow channel 26 to inflate high-pressure air from a pressure pump P into the hollow (i) so as to apply arbitrary pressure Pi on the surface of the mud S from the side of the hollow (i).

Figure 11A:
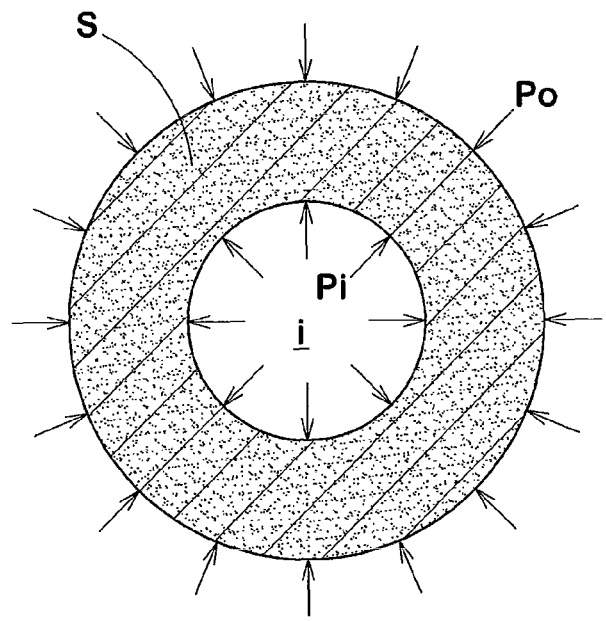
FIGS. 11 (a) and 11(b) are cross-sectional views perpendicular to axis center line, and showing failure of mud in the cylinder of the hollow cylinder tensile test machine.
Figure 11B:
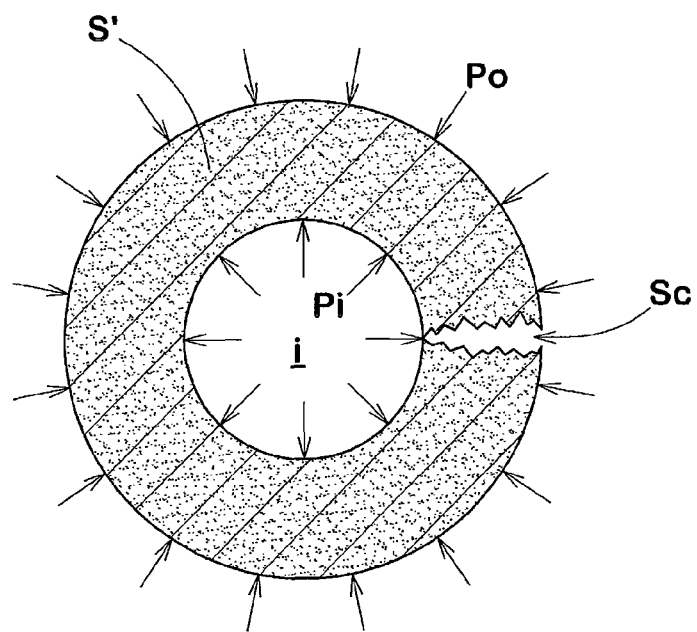

The actions of the tensile test machine 20 are described below. As shown in FIG. 11(a), certain pressures Pi and Po were applied into the pressure chamber 21 and the hollow (i) of container 22, respectively. And, the actuator 23 presses the container 22 so that the compression pressure applied to the container 22 is as much as the external pressure Po. While keeping the pressure Po of the pressure chamber 22 constant, the pressure Pi in the hollow (i) of the container 22 is increased until cracks Sc occurring in the mud S of the container 22 as shown in FIG. 11(b). The pressure P of the actuator 23 is supplemented with the pressure increasing in the hollow (i). A manometer 27 and a flow meter 28 measure the internal pressure Pi and volume increases of the container 22, respectively. In the present embodiment, the hollow cylinder tensile tests have been performed under two levels of external pressure Po of 19.6 kPa and 98.0 kPa.

Mud is unfit for a conventional tensile test. However, the present embodiment allows to test its failure property. In the present embodiment, the mud is contained in the ring-shaped hollow cylindrical container 22; the hollow (i) thereof is applied pressure; and the mud is applied the tensile stress in the circumferential direction until failing.

Figure 12:
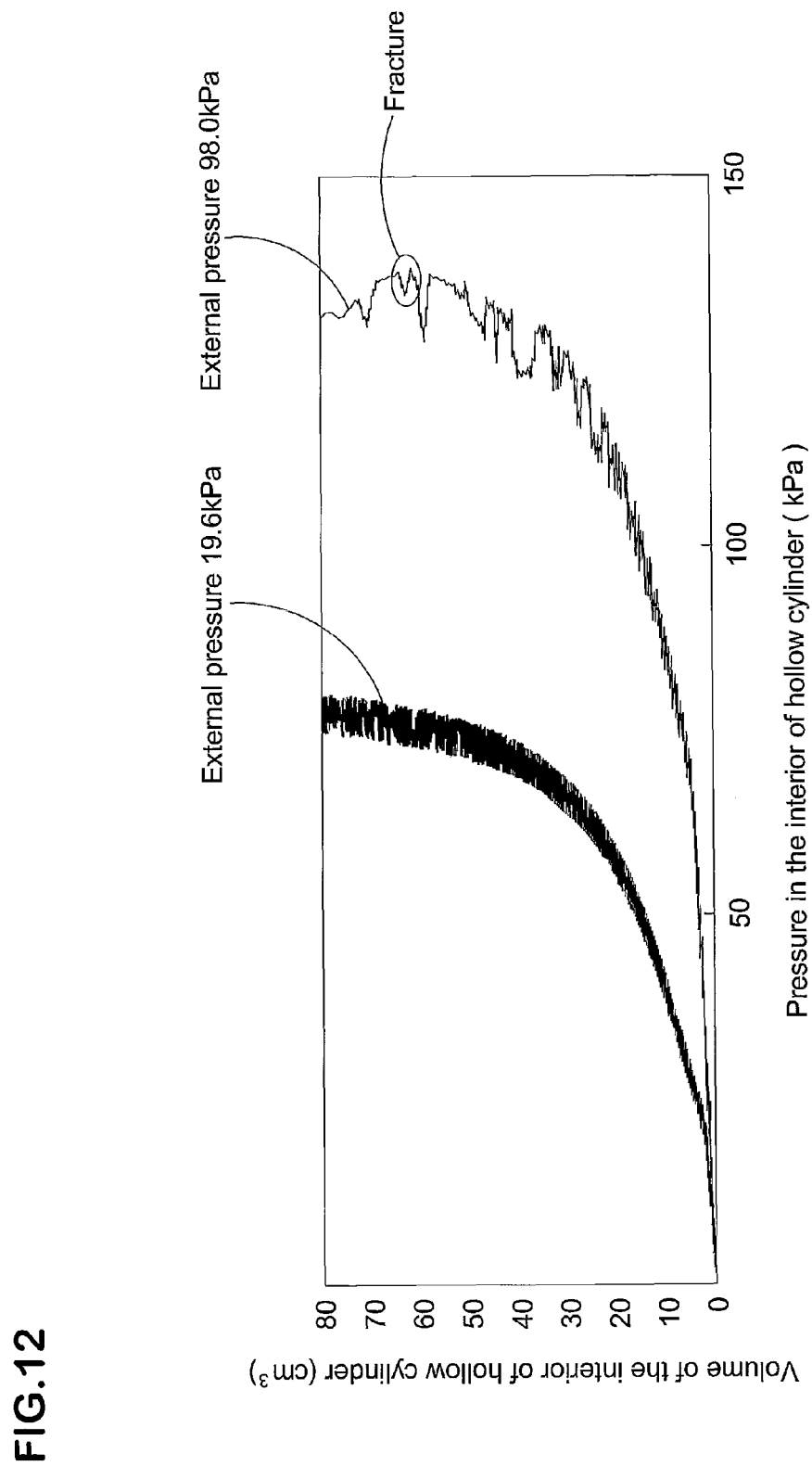
FIG. 12 a graph showing a result of the cylinder of the hollow cylinder tensile tests.

FIG. 12 shows the results of the above-described hollow cylinder tensile tests. The volume of the hollow (i) gradually increases in accordance with the increase of the inner pressure Pi initially. Then, the inner pressure Pi hardly increases, however, the volume of the hollow (i) suddenly increases, and finally yields and then fails. Meanwhile, the failure strain does not depend on the external pressure but is constant. In the present embodiment, the failure strain is stored in the computer device 1.

Unlike snow and sand, mud has strong adhesion. When the tire rolls on such a muddy road surface, the mud adheres on the tread surface of the tire. The mud adhered thereon is pulled by the tire and comes off the road surface. Such a condition is represented in the computer simulation of the present embodiment. In other words, the volume of the mud model 6 gets out when the equivalent plastic strain thereof is over the certain value predetermined based on the failure property under tensile stress condition, so that it is useful in simulating accurately the representation of rolling resistance caused by mud. Adhesion frictional force between the tire surface and the mud occurs also in the tensile stress condition. The adhesion force and adhesion frictional force are predetermined between the tire model 2 and muddy road model 6, and these forces are considered in the deformation calculation for simulation.

Figure 13A:
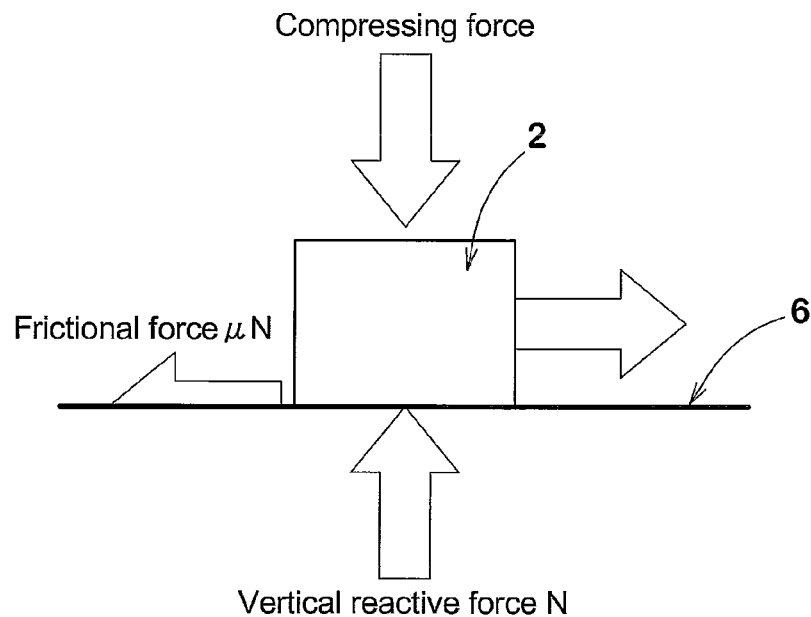
FIGS. 13 (a) and 13(b) are schematic illustrations showing each equilibrium of force between the tire model and the muddy road model.

FIG. 13(a) shows a schematic illustration wherein the tire model 2 and the muddy road model 6 are in compression. In this instance, vertical reactive force N and frictional force $\mu N$ that is caused by locomotion (μ: coefficient of dynamic friction) arise. These forces affect on the tire model 2.

Figure 13B:
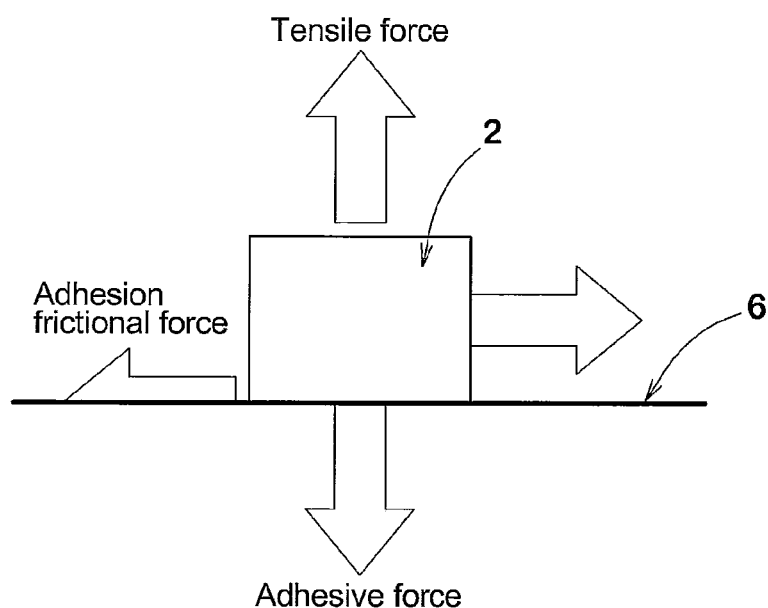

As shown in FIG. 13(b), when the tire model 2 and muddy road model 6 are in the tensile stress condition, the tire model 2 is subjected to adhesive force and frictional force that is caused by locomotion (hereinafter called "adhesion frictional force") βF.

β: A variable depending on slip velocity (<=1)

F: A predetermined maximum adhesion frictional force

The adhesive force is normal force, arises ongoingly, and continues to increase to the break point of the mud material 6c of the muddy road model 6. Moreover, the adhesive force is set to be particularly larger than the breaking strength of the muddy road model 6.

Meanwhile, the adhesion frictional force is a force perpendicular to the above-mentioned adhesive force, and continues to generate until it reaches maximum frictional force. In this way, the simulation with this generation of frictional force under the tensile stress condition, in view of the adhesive force, can represent more accurately the condition of tire rolling in muddy road.

Next, in Step S3 in this present embodiment, boundary conditions for the simulation are set. The boundary conditions include wheel rims, internal pressure of the tire model 2, friction coefficient between the tire model 2 and the muddy road model 6, the tire load, the slip angle, the camber angle, rotating speed (In this embodiment, rotational and translational speeds are set to the tire model 2.), initial time increment for deformation calculation of each model and initial position of each model 2 and 6.

Figure 14:
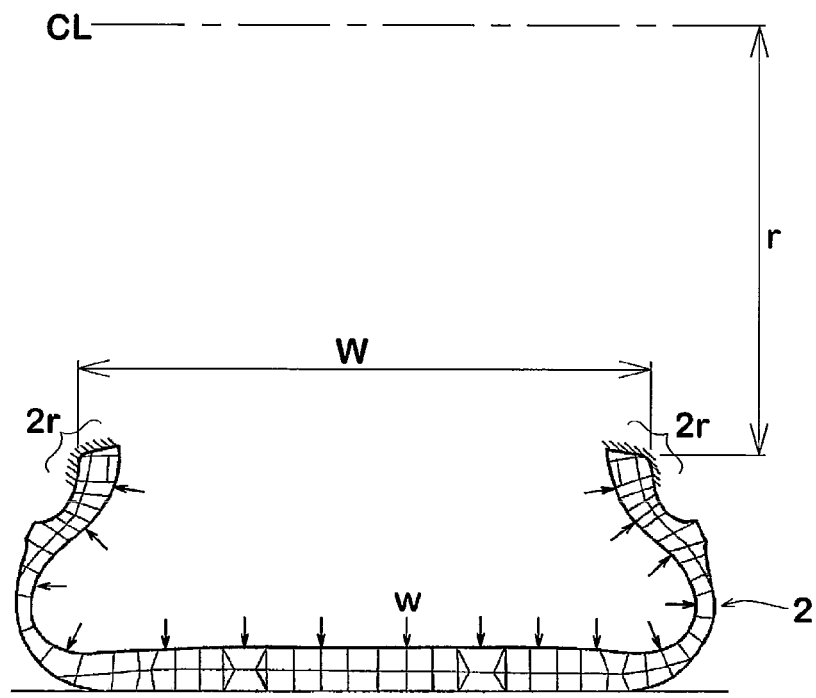
FIG. 14 is a cross sectional view of the tire model.

FIG. 14 shows the virtual rim assembly of the tire model 2. A pair of bead regions 2r of the tire model 2 are equal to the rim width. The radial distance (r) from the rotation axis CL of the tire model 2 to the bead regions 2r is set to be equal to the rim diameter. Further, the internal pressure is expressed by applying an uniformly distributed load (w) having the same value as the internal pressure of the tire on the internal surface of the tire model 2.

Next, in the Steps S4 to S8, deformation calculations of the tire model 2 and the muddy road model are performed. Namely, the state where the tire model 2 rolls on the muddy road model 6 is calculated for every small time increment by using the computer device 1.

The explicit time integration method is employed in the simulation in this present example. According to the explicit method, the moment that the load acts on each model is taken as time zero, and the time is divided into small increments so as to find the displacement of the model at each point in time. The explicit method does not involve convergence calculations. However, it is necessary that the time increment satisfies the "Courant criterion", in order to stabilize the calculations. To be more specific, the initial time increment Δt in the deformation calculation for the tire model 2 and the muddy road model 6 is set at the values that meet the following formula (1).

$$\Delta t < L_{min}/C \quad (1)$$

Figure 15:
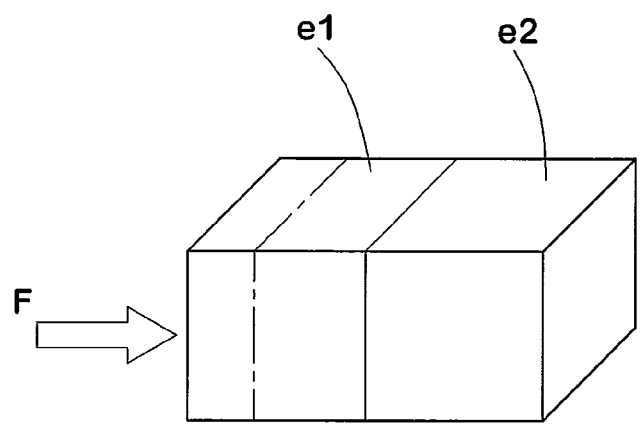
FIG. 15 is a perspective view of an element in the tire model.

Here, "$L_{min}$" is the characteristic length of the smallest element in each model, and "C" is the propagation speed of a stress wave propagating in the material calculated as follows:

$$C = (E/\rho)^{0.5}$$

where E is Young's modulus, and ρ is the density. In the deformation calculations with a time increment that satisfies the Courant criterion, as shown in FIG. 15, it becomes possible to calculate the deformation condition of the element e1 when an external force F acts thereon before the external force F is transferred to the element e2 adjacent to the element e1. This helps to obtain stable solutions.

In this embodiment, the propagating time of the stress wave of each element is calculated based on the formula (1), and after that, the time increment is set up by multiplying the minimum of the propagating time by a safety factor. The safety factor is, for example, more preferably set equal to 0.66. Further, the initial time increment is preferably set of from 0.1 to 5 μsec, more preferably 0.3 to 3 μsec, and most preferably 0.5 to 2 μsec for both the tire model 2 and the muddy road model 6.

As shown in the Steps S4 to S8 in FIG. 2, the deformation calculation of the tire model 2 and the deformation calculation of the muddy road model 6 are performed separately. However, the position, the shape and the speed data of the tire model 2 obtained from the deformation calculation of the tire model 2 are given to the muddy road model 6 as a boundary condition for the deformation calculation of the muddy road model 6 (Step S8). On the other hand, the pressure and frictional force obtained from the deformation calculation of the muddy road model 6 are given to the tire model 2 as the boundary condition (load) for the deformation calculation of the tire model 2 (Step S7).

Figure 16:
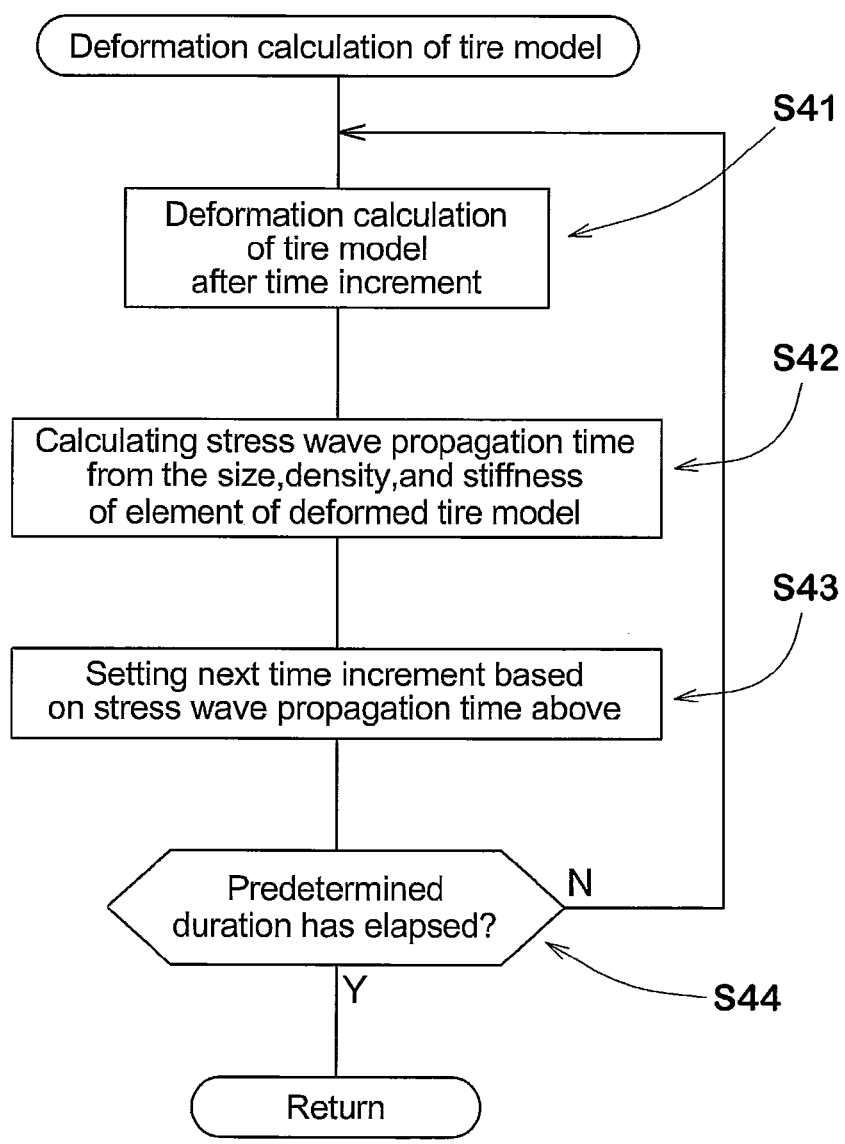
FIG. 16 is a flowchart showing an example of the deformation calculation of the tire model.

FIG. 16 shows an example of the deformation calculation of the tire model 2. In Step S41 shown in FIG. 16, the deformation calculation after the time increment Δt is performed first. The deformation calculation in the present example is performed by the computer device 1 to solve equations of motion. Calculated values indicate the state that the tire rolls on the muddy road model 6 for the time increment Δt.

Next, the stress wave propagation time of each element of the deformed tire model 2 is calculated based on its size, density and stiffness (Step S42). Then, based on the minimum value of this stress wave propagation time, the time increment for the next deformation calculation is set so as to satisfy the courant criterion above (Step S43). Since the stress wave propagation time is a function of the size and density of the element, it changes every time the element deforms. In the present embodiment, the optimum time increment is set in accordance with the deformation of the element, which helps the deformation calculation of the tire model 2 to be performed more accurately.

Next, it is checked whether the predetermined duration of simulation time has been elapsed or not (Step S44). When "No" is selected in the Step S44, the process goes back to the Step S41 to perform one more calculation by adding the newly set time increment. When "Yes" is selected in the Step S44, the deformation calculation of the tire model 2 is terminated and the process goes to the Step S6.

Figure 17:
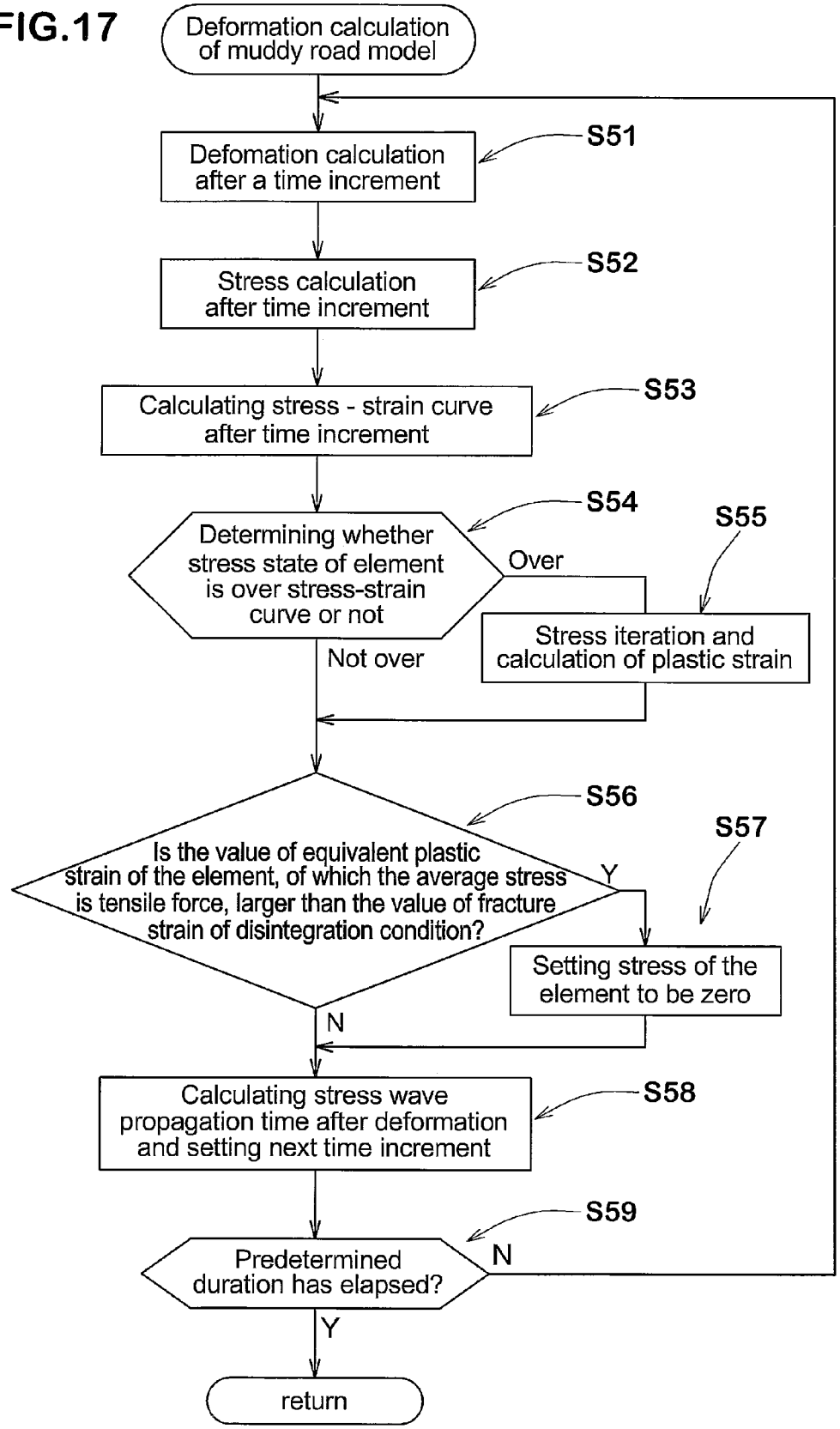
FIG. 17 is a flowchart showing an example of the deformation calculation of the muddy road model.

FIG. 17 shows an example of the deformation calculation of the muddy road model 6. The deformation calculation of the material in each finite volume of the muddy road model 6 is performed after the time increment (Step S51). In this Step 51, the density ρ of each finite volume of the muddy road model 6 is calculated because the density of the mud material 6c of the muddy model 6 changes in accordance with positions of the tire model 2.

The volume strain εv is calculated by the following formula (2) using the current density ρ of each finite volume of the muddy road model 6.

$$\epsilon v = 1 - (\rho/\rho_0) \quad (2)$$

Here, $\rho_0$ is the initial density of the finite volume under zero pressure, and the compressive volume strain is expressed as negative.

Next, the pressure P after the time increment passed is calculated by the following formula (3).

$$P = a_1 \cdot \mu + a_2 \cdot \mu^2 \quad (3)$$

The pressure P is the average value of the three normal stress components that act on each finite volume. Further, "a1" and "a2" are material parameters, $\mu$ is the volume-compression rate (compression is positive) defined by the following formula (4).

$$\mu = -\epsilon v = (\rho/\rho_0) - 1 \quad (4)$$

Next, the stress calculation of the muddy road model 6 after the time increment is performed (Step S52). In this stress calculation, the second invariant $J_2$ of the stress tensor of each finite volume of the muddy road model 6 are calculated using deviatoric stresses of each volume. Each of the normal deviatoric stresses $\sigma_x'$, $\sigma_y'$, and $\sigma_z'$ is calculated by subtracting the pressure P evaluated above from each of the normal stresses, $\sigma_x$, $\sigma_y$, and $\sigma_z$.

$$\sigma_x' = \sigma_x - P \quad (5)$$

$$\sigma_y' = \sigma_y - P \quad (6)$$

$$\sigma_z' = \sigma_z - P \quad (7)$$

The second invariant $J_2$ of the stress tensor is calculated by the following equation (8) using the above deviatoric stress and shear stress components.

$$J_2 = \sigma_x' \cdot \sigma_y' + \sigma_y' \cdot \sigma_z' + \sigma_z' \cdot \sigma_x' - \tau_{xy}^2 - \tau_{yz}^2 - \tau_{zx}^2 \quad (8)$$

In this equation, $\tau_{xy}$, $\tau_{yz}$, and $\tau_{zx}$ are the shear stress components. In this step, strain increments of each finite volume is considered as elastic.

Next, the stress-strain curve of each finite volume of the muddy road model 6 after the time increment is calculated. Since the pressure P of each finite volume has already been calculated in Step S51, the stress-strain curve corresponding to the pressure P and the strain rate is obtained based on the predetermined elastoplastic stress-strain curve shown in FIG. 9 (Step S53).

In Step S54, it is checked whether the present stress state of each finite volume is over the stress-strain curve or not. When it has been determined that the stress of the volume is over the stress-strain curve, an iteration process for decreasing the stress is performed in Step S55.

Figure 18:
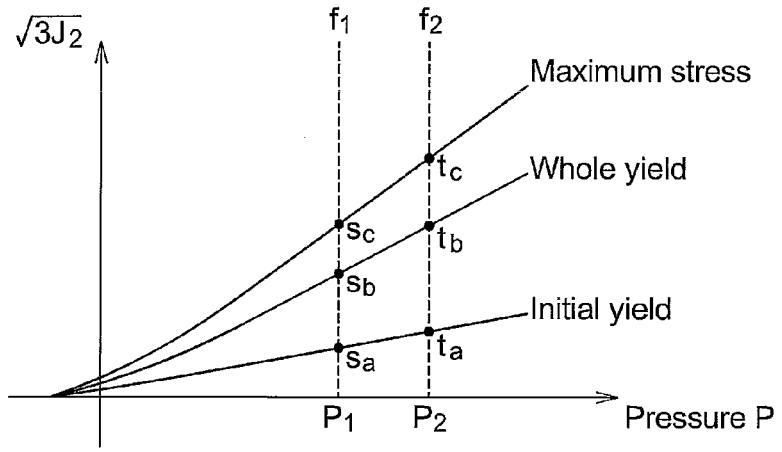
FIG. 18 is a graph showing the relationship between pressure and deviatoric stress.
Figure 19:
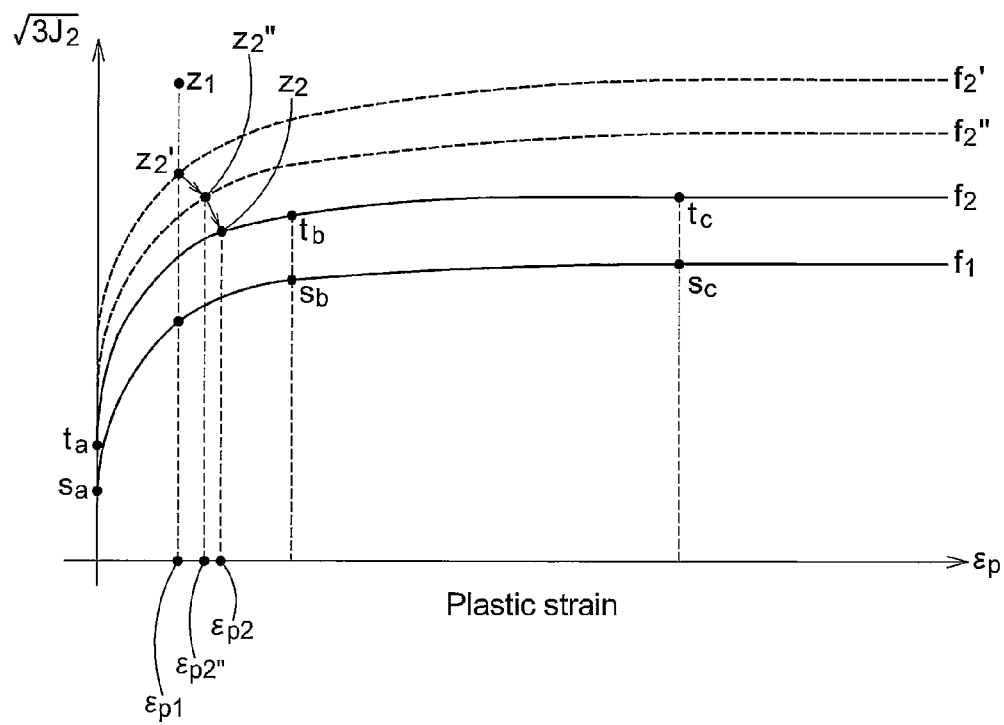
FIG. 19 is a graph showing the relationship between plastic strain and deviatoric stress.

FIG. 18 shows the relationship between a parameter $(3J_2)^{0.5}$ using the second invariant $J_2$ and the pressure P. FIG. 19 shows the relationship between the parameter $(3J_2)^{0.5}$ and the plastic strain $\epsilon_p$.

Namely, in the deformation calculation of the muddy road model in the Step S52, all the increase in each volume of the muddy road model 6 is assumed to be caused by elastic deformation. The Step S54 is therefore needed for verifying correctness of the above-mentioned assumption. When the value of stress state of the volume is over the stress-strain curve, it is necessary to reduce the value to a correct value on the stress-strain curve while recalculating the elastic and plastic deformation and the pressure so as to keep the simulation accuracy high.

To describe an example of Steps S54 and S55, a finite volume is now assumed in a state of z1 and the stress-strain curve is assumed as the curve $f_2'$ as shown in FIG. 19. The state of z1 of the finite volume is over the curve $f_2'$. This means that the deformation of the material is in a plastic region, and an iteration step is performed.

The iteration process may be performed in various ways; in this embodiment the iteration process to decrease the stress of the finite volume is performed until the state z1 becomes on the stress-strain curve. Specifically, the process decreases the stress of the finite volume to state Z' to the stress-strain curve $f_2'$ without changing the plastic strain $\epsilon_{p1}$ of the state $z_2'$.

Next, a new plastic strain $\epsilon_{p2}''$ is obtained by considering the strain caused by reducing the stress from the state z1 to z2' as a plastic component. In the iteration process, the strain corresponding to the difference between the stress state z1 and the stress-plastic strain curve $f_2'$ is regarded as a component of the plastic strain causing plastic deformation to the finite volume.

Next, a new pressure P of the finite volume and the strain velocity are calculated using the stress state of z2'. Then, a new stress-strain curve $f_2''$ is calculated based on the latest pressure P and the relationship of FIG. 9. Then, a new stress state z2'' with a plastic strain $\epsilon_{p2}''$ which lies on the stress-strain curve $f_2''$ is calculated. Further, the plastic strain and the pressure of the finite volume are recalculated, and these process continues until the stress state of the finite volume converges on the stress-strain curve. Accordingly, the stress state z1 of the finite volume is finally decreased to the stress state z2 on the stress-strain curve $f_2$.

In Step 56, when the average stress of a finite volume of the muddy road model 6 is tensile force, the equivalent plastic strain of the volume is compared to the predetermined failure strain of failure condition. If the value of equivalent plastic strain is larger than that of the failure strain, the stress of the volume is set to be zero (Step 57).

The adhesive force is sufficiently-larger than the failure breaking strength. The volume after Step 57 therefore pulls out of the muddy road model 6 and attaches to the tire model 2 owing to the adhesive force. Meanwhile, when the volume of mud attached to the tire model 2 connects again to ground and that the average strain increment get back to compression, the mud volume can regenerate stress.

In this way, considered are the travel resistance caused by mud addressing and the detachment from a road surface caused by mud fracturing in the simulation.

In this embodiment, the stress wave propagation time of each finite volume of the deformed muddy road model 6 is recalculated, and a value equal to the minimum value of the stress wave propagation time multiplied by the safety factor is set as the next time increment (Step S58).

Next, it is checked whether the predetermined simulation duration has elapsed or not (Step S59). When it has not, the process goes back to Step S51 and recalculation is performed again with the newly set time increment. When it has elapsed, the deformation calculation of the muddy road model 6 is terminated to return to Step S6 of FIG. 2.

In Steps S7 and S8 in FIG. 2, necessary data obtained from the results of the individual calculations of the tire model 2 and muddy road model 6 are exchanged between these models so as to couple them. The pressure data of the muddy road model 6 is given to the tire model 2 as a load for next deformation calculation thereof. On the other hand, the shape and speed of the tire model 2 are given to the muddy road model 6 as a boundary condition for the next deformation calculation thereof.

Accordingly, it becomes possible for the muddy road model 6 to calculate changes in the reaction force on the tire model 2 due to changes in the position or shape of the tire model 2. For the tire model 2, it becomes possible to calculate a new deformation due to the reaction force received from the muddy road model 6. Repeating these calculations can analyze the changing contact situation between the tire model 2 and the muddy road model 6, while considering their interaction.

In Step S6, it is checked whether the predetermined duration that indicates the completion of calculation has elapsed or not. When "Yes" is selected in Step S6, the calculation results are outputted (Step S9), and the simulation procedure is terminated. The duration of the calculations in Step S6 can be determined according to the simulation to be executed so as to obtain stable calculation results.

The output of the calculation results may contain various information. For example, pressure and plastic strain distribution of the muddy road model 6 and longitudinal and/or side force applied on the tire model 2 may be obtained. Any physical parameters involved in the tire model 2 and the muddy road model 6 calculations may be obtained as output information.

Figure 20A:
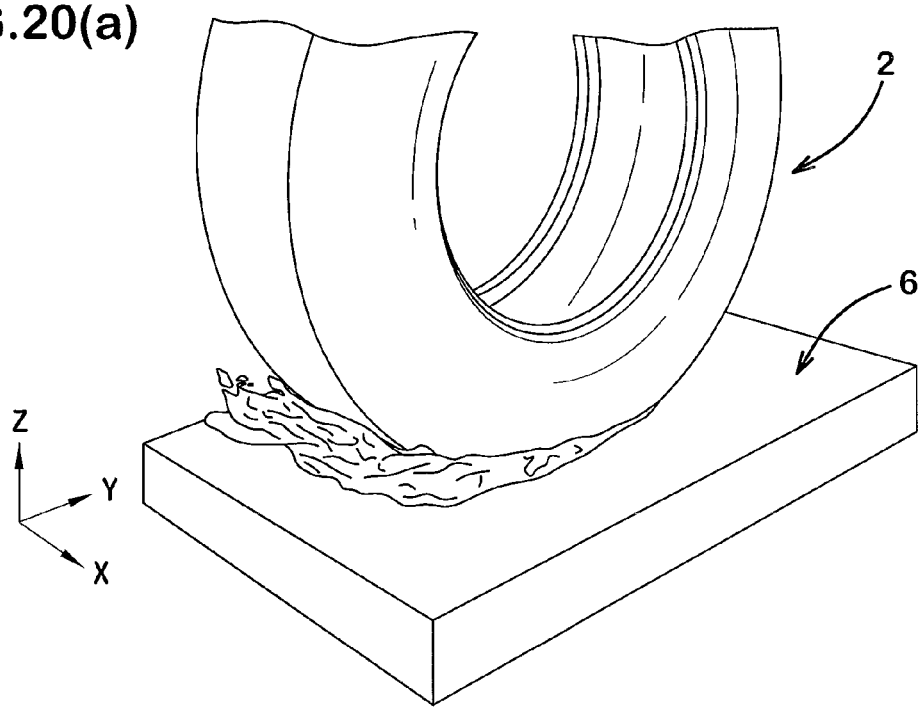
FIGS. 20(a) and 20(b) are visualized perspective views of tires on rolling simulation.
Figure 20B:
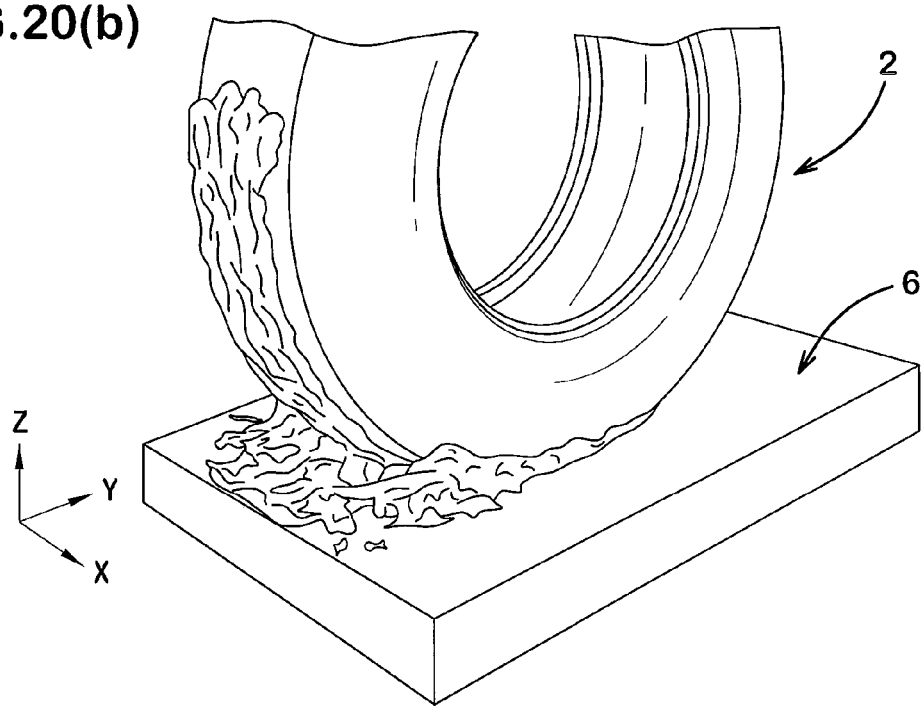

FIGS. 20 (*a*) and (*b*) are visualized the tire model 2 and muddy road model 6 during rolling simulation. FIG. 20(*b*) follows FIG. 20(*a*) with time and shows that muddy volumes are visible adhering on the surface of tire model 2.

Based on the outputted information of the simulation, designers and analysts can device modifications of internal structure of tire, profile of tread, tread grooves, tread patterns or sipes, internal pressure of tire, and used rubber materials. It is also possible to prototype the tire version that have shown preferable simulation results. This greatly accelerates the process of development of tires for mud, thereby reducing the development time and cost.

In this embodiment described above, the tire model 2 is made to roll on a stationary muddy road model 6. However, it is possible that a tire model 2 with a free rotating tire axis is driven by friction force from a moving muddy road model 6 in contact with the tread of the tire model 2.

The invention claimed is:

1. A method for tire rolling simulation on mud comprising the steps of:
   modeling a tire using finite elements to build a tire model;
   modeling a muddy road covered with mud using finite volumes to build a muddy road model which can exhibit elastoplasticity property, and failure property in which the finite volume fails under a certain tensile stress, but does not fail under any compression stress; and
   executing a numerical simulation in which the tire model is made to roll on the muddy road model in a predetermined condition.

2. The method for tire rolling simulation on mud according to claim 1, wherein
   travel resistance is reproduced by predetermining adhesion and traction between said tire model and muddy road model in the step of executing a numerical simulation.

3. The method for tire rolling simulation on mud according to claim 1, wherein
   the elastoplasticity is defined using a predetermined relationship between the stress and the strain of the mud, and
   the relationship is obtained from triaxial compression tests in which the mud is compressed with an axial force under at least two different levels of external constant pressure.

4. The method for tire rolling simulation on mud according to claim 3, wherein
   the relationship between the stress and strain of the mud has a first region and a second region,
   the first region exhibits a smooth increase of strain with increase of the stress, and
   the second region exhibits a smooth increase of stress from the yield point with increase of the strain.

5. The method for tire rolling simulation on mud according to claim 1, wherein
   said failure property is defined using the steps of:
   executing hollow cylinder tensile tests, the test comprising the steps of
     forming a hollow cylinder by using mud, and
     destroying the hollow cylinder by increasing internal pressure under at least two different levels of external constant pressure; and
   calculating failure strain based on the values obtained by hollow cylinder tensile tests.

6. The method for tire rolling simulation on mud according to claim 1, wherein said simulation comprising the steps of:
   calculating stress of said each finite volume of the muddy road model;
   calculating a curve of relation between the stress and plastic strain;
   determining whether said each stress of the volume is over the value on the stress-strain curve or not; and
   when the stress value of the volume is over the stress-strain curve, the stress value is modified on a value of the stress-strain curb.

* * * * *